(12) United States Patent
McLeod et al.

(10) Patent No.: US 7,193,543 B1
(45) Date of Patent: Mar. 20, 2007

(54) CONVERSION CLOCK RANDOMIZATION FOR EMI IMMUNITY IN TEMPERATURE SENSORS

(75) Inventors: Scott C. McLeod, Oro Valley, AZ (US); Kenneth W. Gay, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 0 days.

(21) Appl. No.: 11/219,399

(22) Filed: Sep. 2, 2005

(51) Int. Cl.
*H03M 1/00* (2006.01)

(52) U.S. Cl. .................................. 341/123; 374/170

(58) Field of Classification Search ................ 341/122, 341/123, 155; 374/170, 173
See application file for complete search history.

(56) References Cited

U.S. PATENT DOCUMENTS

| | | | |
|---|---|---|---|
| 3,672,215 A | 6/1972 | Stout et al. | |
| 3,679,992 A | 7/1972 | Yerman | |
| 4,228,684 A | 10/1980 | Templin | |
| 5,195,827 A | 3/1993 | Audy et al. | |
| 5,419,637 A | 5/1995 | Frye et al. | |
| 5,639,163 A * | 6/1997 | Davidson et al. ........... | 374/178 |
| 5,982,221 A | 11/1999 | Tuthill | |
| 6,008,685 A | 12/1999 | Kunst | |

(Continued)

FOREIGN PATENT DOCUMENTS

| | | |
|---|---|---|
| DE | 3637250 A1 | 6/1987 |
| EP | 498799 A1 | 8/1992 |
| EP | 741860 A1 | 11/1996 |
| GB | 2292221 A | 2/1996 |

OTHER PUBLICATIONS

Shen-Whan Chen, Trung Duong and Min-Yih Luo; "Channel Temperature Measurement Using Pulse-Gate Method"; IEEE Transactions on Microwave Theory and Techniques; Mar. 1999; pp. 362-365; vol. 47, No. 3.

S. Kaliyugavaradan, P. Sankaran and V. G. K. Murti; "Application of Reciprocal Time Generation Technique to Digital Temperature Measurement"; IEEE Transactions on Instrumentation and Measurement; Feb. 1994; pp. 99-100; vol. 43, No. 1.

(Continued)

*Primary Examiner*—Howard L. Williams
(74) *Attorney, Agent, or Firm*—Meyertons Hood Kivlin Kowert & Goetzel, P.C.; Jeffrey C. Hood

(57) ABSTRACT

In one set of embodiments, a temperature measurement system may include an analog to digital converter (ADC) to produce digital temperature readings according to a difference base-emitter voltage ($\Delta V_{BE}$) developed across a PN-junction. A clock generating circuit may be configured to provide a sampling clock used by the ADC, which in some embodiments may be a delta-sigma ADC, in performing the conversions. The clock generating circuit may be configured to change the frequency of the sampling clock a specified number of times within each one of the one or more conversion cycles to reduce an error component in the temperature measurement, where the error component is produced by an interfering signal, such as an electromagnetic interference (EMI) signal being coherent with the sampling clock, and/or a noise residing on the voltage supply and also being coherent with the sampling clock.

26 Claims, 3 Drawing Sheets

U.S. PATENT DOCUMENTS

| | | |
|---|---|---|
| 6,097,239 A | 8/2000 | Miranda, Jr. et al. |
| 6,169,442 B1 | 1/2001 | Meehan et al. |
| 6,370,186 B1 * | 4/2002 | Gustafsson et al. ......... 375/216 |
| 6,473,008 B2 * | 10/2002 | Kelly et al. ................. 341/155 |
| 6,554,469 B1 | 4/2003 | Thomson et al. |
| 6,554,470 B2 | 4/2003 | Zhang et al. |
| 6,792,060 B1 * | 9/2004 | Dujardin et al. ............ 375/355 |
| 6,847,319 B1 | 1/2005 | Stockstad |
| 2005/0062625 A1 * | 3/2005 | Stoll .......................... 341/123 |
| 2006/0193370 A1 | 8/2006 | St. Pierre et al. |

OTHER PUBLICATIONS

Cao Hui and Huang Junnai; "Circuit Design and Implementation for Digital Temperature and Humidity Measurement and Control"; Proceedings of the 4th International Conference on; Oct. 2001; pp. 502-505.

* cited by examiner

CONVERSION CLOCK RANDOMIZATION FOR EMI IMMUNITY IN TEMPERATURE SENSORS

BACKGROUND OF THE INVENTION

1. Field of the Invention

This invention relates generally to the field of integrated circuit design and, more particularly, to the design of temperature measurement circuits.

2. Description of the Related Art

Many digital systems, especially those that include high-performance, high-speed circuits, are prone to operational variances due to temperature effects. Devices that monitor temperature and voltage are often included as part of such systems in order to maintain the integrity of the system components. Personal computers (PC), signal processors and high-speed graphics adapters, among others, typically benefit from such temperature monitoring circuits. For example, a central processor unit (CPU) that typically "runs hot" as its operating temperature reaches high levels may require a temperature sensor in the PC to insure that it doesn't malfunction or break due to thermal problems.

Often, integrated circuit (IC) solutions designed to measure temperature in a system will monitor the voltage across one or more PN-junctions, for example a diode or multiple diodes at different current densities to extract a temperature value. This method generally involves amplifying a small voltage generated on the diode(s), and then subtracting voltage from the amplified temperature-dependent voltage in order to center the amplified value for conversion by an analog-to-digital converter (ADC). In other words, temperature-to-digital conversion for IC-based temperature measuring solutions is often accomplished by measuring a difference in voltage across the terminals of typically identical diodes when different current densities are forced through the PN junctions of the diodes. The resulting change ($\Delta V_{BE}$) in the base-emitter voltage ($V_{BE}$) between the diodes is generally proportional to temperature. (It should be noted that while $V_{BE}$ generally refers to a voltage across the base-emitter junction of a diode-connected transistor and not a voltage across a simple PN-junction diode, for the sake of simplicity, $V_{BE}$ is used herein to refer to the voltage developed across a PN-junction in general.) More specifically, $V_{BE}$ may be defined as a function of absolute temperature by the equation $$V_{BE} = \eta \frac{kT}{q} \ln \frac{I_C}{I_S} \quad (1)$$

where $\eta$ is the ideality factor of the PN junction, k is Boltzman's constant, q is the charge of a single electron, T represents absolute temperature, $I_S$ represents saturation current and $I_C$ represents the collector current. A more efficient and precise method of obtaining $\Delta V_{BE}$ is to supply the PN junction of a single diode with two separate and different currents in a predetermined ratio. Consequently, $\Delta V_{BE}$ may be related to temperature by the equation $$\Delta V_{BE} = \eta \frac{kT}{q} \ln(N) \quad (2)$$

where N is a constant representing a pre-selected ratio of the two separate currents that are supplied to the PN junction of the diode.

In certain cases, for example when the diode or PN-junction—which is being monitored to obtain temperature measurements—is remotely coupled to the measurement system through a twisted pair of wires, the output temperature reading may artificially increase due to system noise. More specifically, Electromagnetic Interference (EMI) may modulate the diode voltage $V_{BE}$, resulting in inaccurate temperature-readings, as the ADC configured in the temperature measurement system can typically not differentiate between a noise-induced temperature increase versus true temperature increase.

Other corresponding issues related to the prior art will become apparent to one skilled in the art after comparing such prior art with the present invention as described herein.

SUMMARY OF THE INVENTION

In one set of embodiments, a temperature measurement system may include a PN-junction, which may be configured in a diode-connected bipolar junction transistor, and an analog to digital converter (ADC) configured to produce digital temperature readings according to a difference base-emitter voltage ($\Delta V_{BE}$) developed across the PN-junction. A clock generating circuit may be configured to provide a sampling clock used by the ADC, which may be a delta-sigma ADC, to perform the required sampling. The clock generating circuit may be configured to step the frequency of the sampling clock such that if an electromagnetic interference (EMI) signal induces an error at a particular conversion (sampling) clock frequency, such error would only be present for a substantially reduced fraction of a given conversion cycle.

In one embodiment, the clock generating circuit is configured to step the frequency of the sampling clock a specified number of times within each conversion cycle. Each step frequency may be obtained through frequency division, based on a reference clock with a set frequency, using a different division factor for each step frequency within each conversion cycle. In one set of embodiments, the clock generating circuit may include an oscillator for generating the reference clock, where a minimum value for the set frequency of the reference clock may be determined based on a nominal frequency of the sampling clock and the step resolution. The reference clock signal may be provided to a frequency divider configured to generate the sampling clock according to a division factor received from a division factor generator block. A clock edge counter may count a specified number of edges of the sampling clock, and assert a control signal to the division factor generator block upon having completed the count. In response to the control signal being asserted, the division factor generator block may provide a different division factor to the frequency divider, the sampling clock produced by the frequency divider thereby having a changed frequency.

In one set of embodiments, the control signal may be an increment signal, whereby each successive division factor is larger than the previous one, resulting in each successive frequency of the sampling clock being lower than the previous one, until the end of the conversion cycle has been reached. Each new conversion cycle may begin with the division factor generator providing a default division factor, subsequently providing a next division factor from a previously determined set of division factors, as described above. The number of different division factors may be determined based on the desired frequency resolution, that is, the smallest frequency increment by which the frequency of the sampling clock is to be changed for each step. The clock edge counter may be configured to count as little as one edge or as many as any number of specified edges, prior to asserting the increment signal. Any error caused by an interfering signal being coherent with the sampling clock running at the nominal frequency may therefore be reduced, with a smaller frequency increment resulting in a proportionately smaller error.

BRIEF DESCRIPTION OF THE DRAWINGS

The foregoing, as well as other objects, features, and advantages of this invention may be more completely understood by reference to the following detailed description when read together with the accompanying drawings in which.

Figure 1:
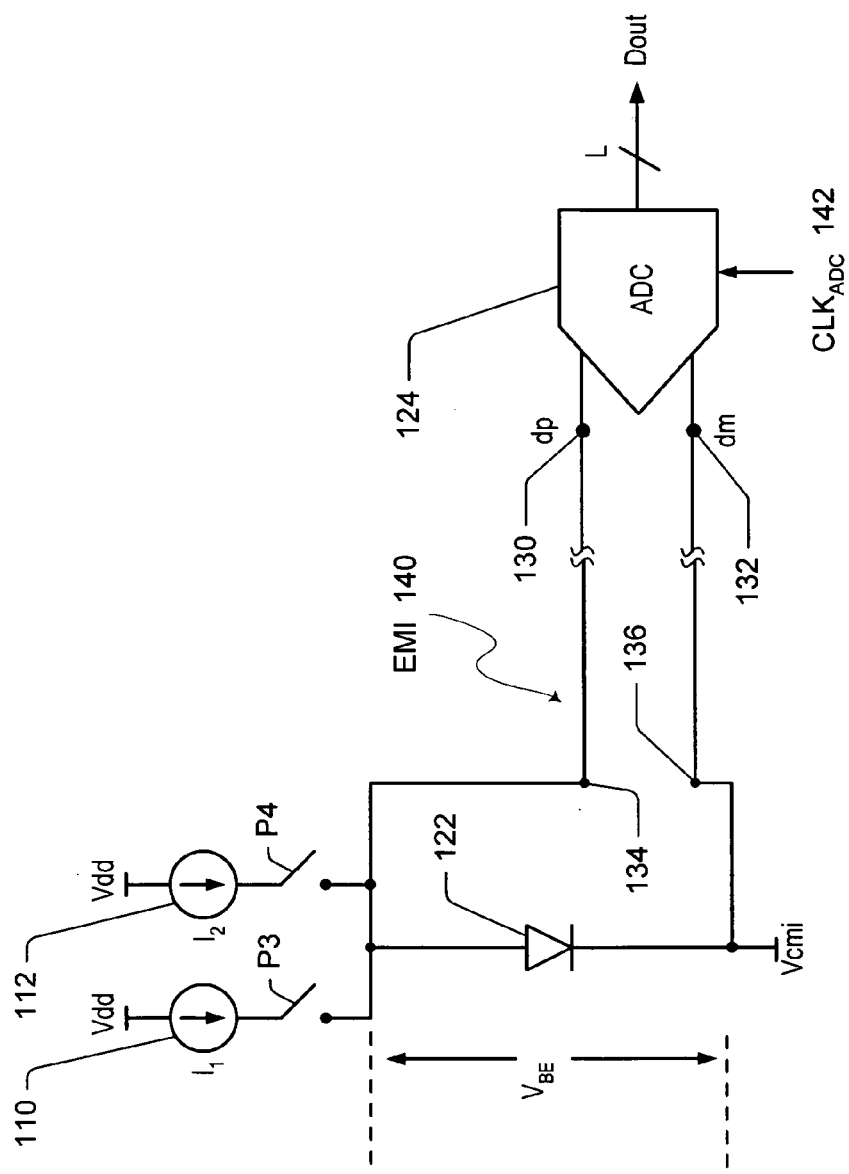
FIG. 1 shows a block diagram of one embodiment of a temperature sensor circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE PREFERRED EMBODIMENTS

As used herein, the word "alternately" is meant to imply passing back and forth from one state, action, or place to another state, action, or place, respectively. For example, "alternately applying a first current source and a second current source" would mean applying the first current source, then applying the second current source, then applying the first current source, then applying the second current source, and so on.

A "diode-junction-voltage" ($V_{BE}$) refers to a voltage measured across the junction of a diode, or a difference in voltage between a voltage measured at the anode of the diode junction with respect to a common ground and a voltage measured at the cathode of the diode junction with respect to the common ground. A "change in diode-junction-voltage" ($\Delta V_{BE}$) refers to a change in diode-junction-voltage for a chosen diode, either in time or in different circuit configurations. For example, if in one circuit configuration $V_{BE}$=700 mV for a diode, and in a different circuit configuration $V_{BE}$=655 mV for the same diode, then $\Delta V_{BE}$=45 mV for the diode when referencing the two different circuit configurations. Similarly, for example, if at a time point t1 $V_{BE}$=650 mV for a diode, and at a time point t2 $V_{BE}$=702 mV for the diode, then $\Delta V_{BE}$=52 mV for the diode when referencing time points t1 and t2.

A diode is one device (or class of devices) that comprises a PN-junction across which voltage measurements to obtain $V_{BE}$ may be made. More generally, diode-junction may also mean PN-junction or NP-junction, characterizing the physical attributes of the junction selected for obtaining temperature values by performing voltage measurements. Various embodiments are described as configured with a diode or multiple diodes. However, in other embodiments, $V_{BE}$ measurements may be achieved via PN-junctions (or NP-junctions) present in devices other than diodes, for example bipolar junction transistors (BJTs). Therefore, the terms PN-junction, NP-junction, diode, diode-junction, and $V_{BE}$ junction are used interchangeably, and all respective terms associated therewith may be interpreted accordingly.

FIG. 1 illustrates a block diagram of one embodiment of a temperature sensor circuit implemented in accordance with the present invention. In the embodiment shown, current sources $I_1$ 110 and $I_2$ 112 may be individually coupled to diode 122 via respective switches P3 and P4. Diode 122 may be remotely coupled to the inputs of ADC 124 as shown. ADC 124 may operate according to a sampling clock $CLK_{ADC}$ 142. For more detail on possible embodiments of ADC 124 and the coupling of diode 122 to ADC 124, please refer to U.S. Pat. No. 6,847,319 titled "Temperature-to-Digital Converter" invented by Troy L. Stockstad and issued on Jan. 25, 2005, which is hereby incorporated by reference in its entirety as though fully and completely set forth herein. One possible way of operating the circuit of FIG. 1 may be by alternately applying $I_1$ 110 and $I_2$ 112 to diode 122, with the resulting $\Delta V_{BE}$ across diode 122 used by ADC 124 to provide a numeric (digital) value corresponding to the temperature of diode 122. ADC 124 may provide an L-bit output, where L may be selected based on the desired resolution of the digital value. In one set of embodiments, the value of $I_1$ may be an integer multiple of the value of $I_2$, as also shown in equation (2). It should be noted that diode 122 is shown for illustrative purposes, and other semiconductor devices that have a substantially non-linear input-output characteristic that varies with temperature, for example, a diode-connected bipolar junction transistor (BJT), may be used in lieu of diode 122. Also shown in FIG. 1 is EMI signal 140 that may induce a current in the wires coupling anode terminal 134 and cathode terminal 136 of diode 122 to corresponding input terminals 130 and 132, respectively, of ADC 124.

One solution to the EMI problem in temperature measurement circuits is to couple a large capacitor (not shown), typically in the range of 2200 pF, across terminals 134 and 136 of remotely coupled diode 122. The large capacitor may shunt EMI signal 140 away from remote diode 122, keeping the current through remote diode 122 substantially constant, thereby preventing EMI induced measurement errors. However, even with capacitive filtering across remote temperature sensing diode 122, when EMI signal 140 is near in frequency to the sampling frequency used by ADC 124, or is a harmonic of the sampling frequency used by ADC 124, a residual temperature reading error may appear in the output Dout of ADC 124. More generally, in certain circuit and/or system configurations, EMI signal 140 may be coherent with the sampling clock signal used by ADC 124, meaning that EMI signal 140 may alias back into the passband of ADC 124, resulting in inaccurate readings.

In one set of embodiments, the frequency of a conversion clock used by ADC 124 may be randomized such that EMI signal 140 may only affect the temperature reading provided by the output of ADC 124 during a fraction of the complete conversion cycle of ADC 124. The conversion cycle of ADC 124 may be interpreted as the time period during which all samples required to form a single digital output of ADC 124 are obtained. For example, if ADC 124 is configured with an 11-bit output, 2048 samples may be required to perform a single conversion. Randomizing the frequency of the conversion clock used by ADC 124 during a single conversion cycle may effectively reduce and/or eliminate any residual signal errors caused by EMI signal 140 having a frequency that is a multiple of or matches the nominal sampling frequency of ADC 124.

In one embodiment, the frequency of the conversion clock used by ADC 124 is changed, or stepped, to a different value a specified number of times during a single conversion cycle, each frequency value being different from the other. By stepping the conversion clock frequency in this manner, if EMI signal 140 induces an error at a particular conversion clock frequency, for example the nominal sampling frequency of ADC 124, it may only do so for a fraction of the complete conversion cycle. In general, by changing or stepping the sampling (or clock) frequency of ADC 124 throughout the conversion cycle, any error introduced by an EMI signal 140 that is coherent with the sampling (or clock) frequency of ADC 124 may be reduced by the number of different values (or clock steps).

For example, a 6-degree error may be induced in a temperature sensor comprising ADC 124 when the conversion clock is at 100 kHz for the complete conversion cycle. Changing the frequency of the conversion clock to 32 different values (100 kHz being one of those frequencies) over a complete conversion cycle, with an equal amount of the conversion time spent at each frequency, the EMI induced error may be reduced by a factor of 32. This may reduce the EMI induced error from 6 degrees to 0.1875 degrees. Therefore, as the number of different frequency values that are used is increased, the residual effect of EMI signal 140 is proportionally decreased. The range of available frequency values may be determined by the clock operating range of ADC 124. For example, if ADC 124 is configured for a nominal sampling frequency of 100 KHz with a capacity to operate within a frequency range of ±20% the nominal frequency, the range of frequency values may be bounded by 80 KHz on the low end and 120 KHz on the high end. For ease of implementation, the number of different frequency values used may be chosen to coincide with a number that is a power of 2. Accordingly, the aforementioned range may allow 32 values, or 32 1 KHz steps. Alternatively, if the resolution is increased to 0.5 KHz steps, 64 values may be used. Any combination of step resolution and corresponding number of frequency values may similarly be determined according to the frequency operating range of ADC 124.

In one set of embodiments, each frequency value within the range of desired frequency values may be obtained by dividing a high base-frequency, or control-frequency (Fcontrol) by appropriate respective divide values. A minimum control-frequency may also be determined according to the lowest and highest frequency values comprised in the desired range of frequency values, and the number of different frequency values to be generated according to the step resolution. By way of example, using an approximate operating range of ±20% of the nominal operating frequency of 100 KHz, and selecting 32 1 KHz steps, the minimum frequency may be set at 85 KHz, and the maximum frequency may be set at 116 KHz. The minimum required control frequency may then be determined according to:

$$85 \text{ KHz} = F\text{control}/(D+31), \text{ and} \tag{3}$$

$$116 \text{ KHz} = F\text{control}/D, \tag{4}$$

where 'D' represents a minimum divide value required to obtain the maximum frequency of 116 KHz by dividing control frequency Fcontrol. Accordingly:

$$85*D + 85*31 = 116*D, \tag{5}$$

from which a value of 'D' may be determined, in this case 85, leading to an Fcontrol value of 9.86 MHz. It should be noted again, that the value of Fcontrol thus obtained represents a minimum value for a control frequency from which the 32 frequency values for the desired range of frequency values may be derived, with a selected step-size of 1 KHz between each frequency. Fcontrol may be higher or lower depending on the step size and frequency operating range of ADC 124.

Figure 2:
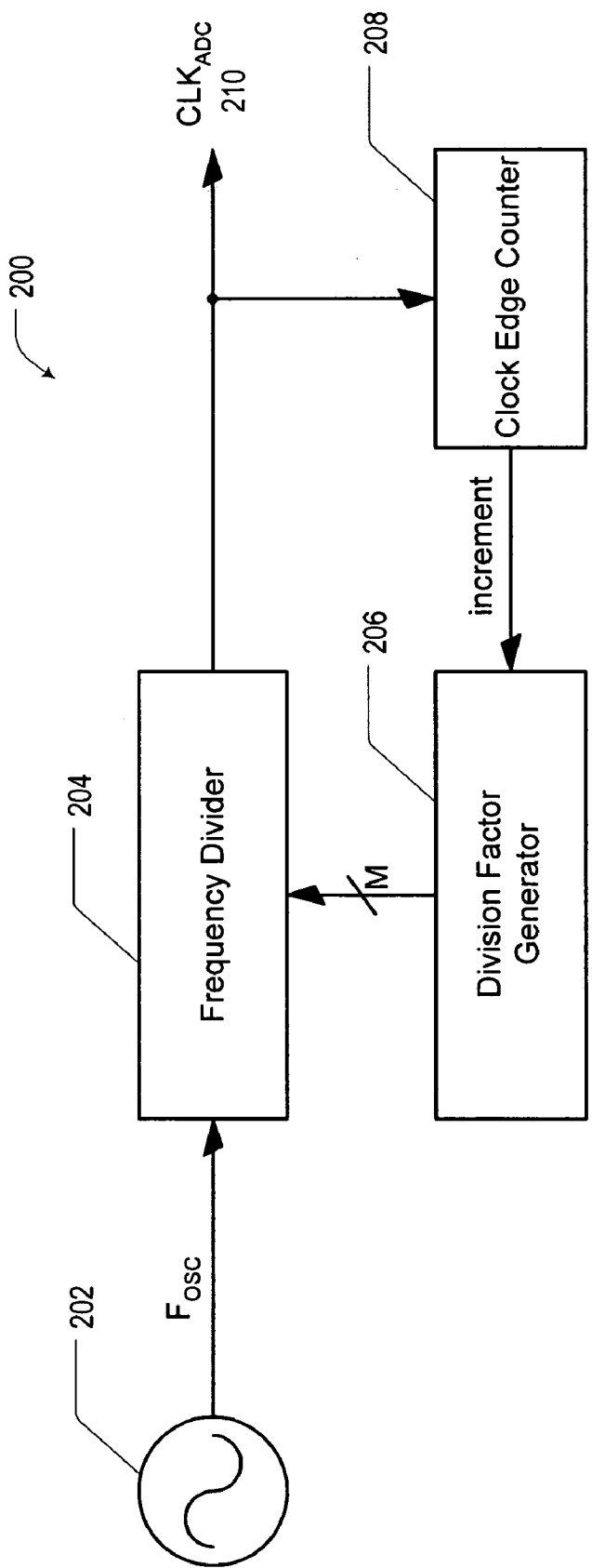
FIG. 2 shows one embodiment of a circuit configured for providing a conversion clock to an analog to digital converter.

FIG. 2 shows one embodiment of a circuit 200 used for providing a conversion clock $CLK_{ADC}$ 210 to an ADC, such as ADC 124 configured in a temperature sensor. Circuit 200 may be configured to provide $CLK_{ADC}$ 210 at each frequency value of $CLK_{ADC}$ 210 for a specified number of cycles of $CLK_{ADC}$ 210. Oscillator 202 may provide a high control-frequency ($F_{OSC}$) signal to frequency divider 204. Frequency divider 204 may operate to divide the $F_{OSC}$ signal by one of a specified number of different divide values, where each value may be determined by an M-bit address provided to frequency divider 204 by division factor generator 206. Division factor generator 206 may increment the M-bit output address every time the increment signal supplied by clock edge counter 208 is asserted. The output signal $CLK_{ADC}$ 210 of frequency divider 204 may be configured as the sampling clock used by an ADC, for example ADC 124. $CLK_{ADC}$ 210 may also be fed back to clock edge counter 208, which may be configured to count a specified number of edges of $CLK_{ADC}$ 210, and output the increment signal to division factor generator 206 at the end of each count. Clock edge counter 208 may be configured to effectively count one, or more than one edge of $CLK_{ADC}$ 210 at any given frequency of $CLK_{ADC}$ 210, before issuing the increment signal to division factor generator 206.

In one set of embodiments, in order to achieve a 50% duty cycle for $CLK_{ADC}$ 210, frequency divider 204 may be configured to further divide by 2 the signal obtained following the division of $F_{OSC}$ by the divide value determined by the M-bit address. Thus, $F_{OSC}$ may be set to a value that's approximately double the value of Fcontrol determined according to the example presented above, including equations (3), (4), and (5). Accordingly, the minimum divide value 'D' may also be doubled, and incremented by 2 at each step for obtaining each subsequent frequency value. In alternate embodiments, both, the rising and falling edges of the $F_{OSC}$ signal may be used in conjunction with a half-integer divider, (i.e. D/2 instead of D, and increments of 0.5 instead of 1) providing commensurate results.

Figure 3:
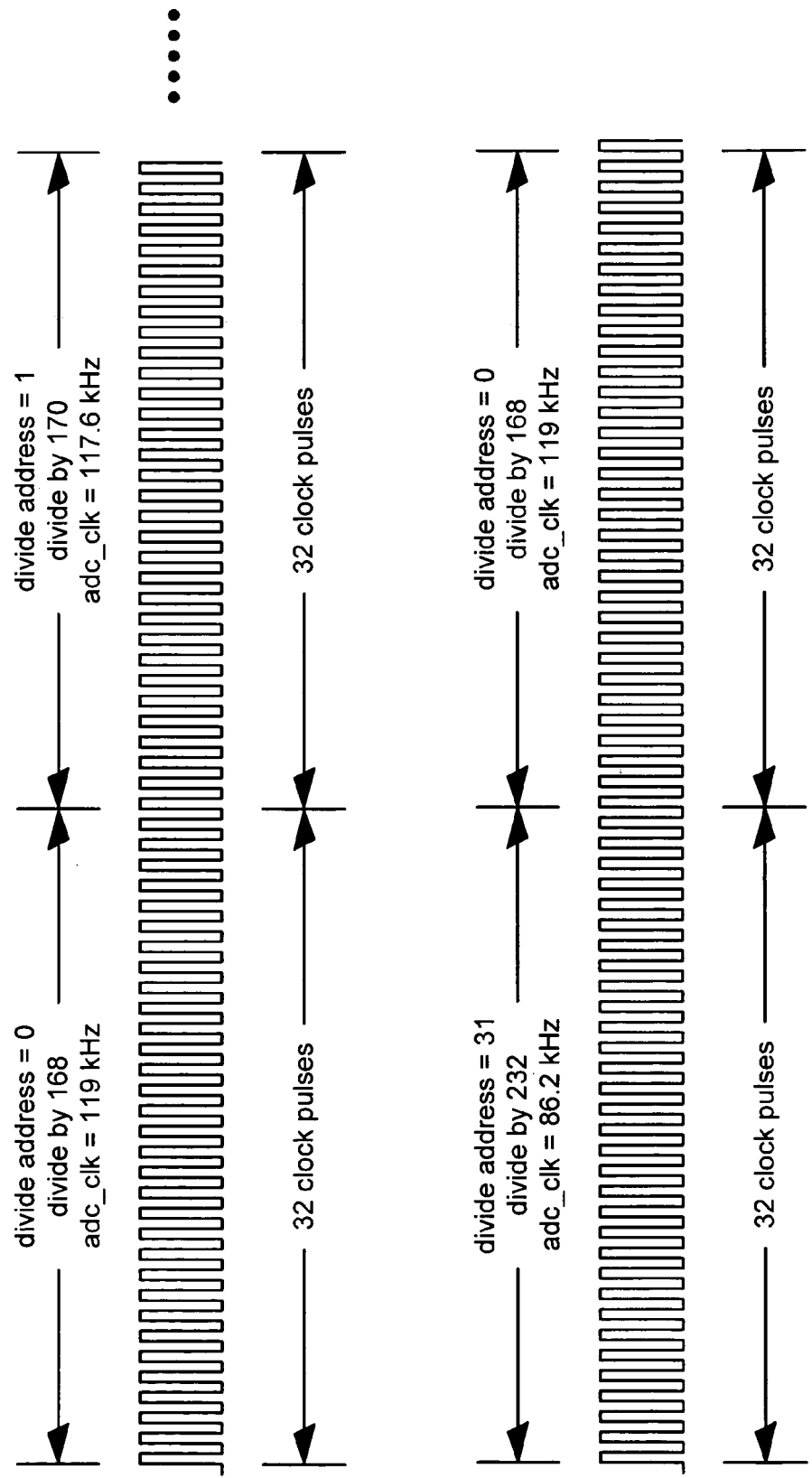
FIG. 3 shows a timing diagram of one example of the conversion clock generated according to the embodiment shown in FIG. 2.

FIG. 3 shows a timing diagram of one example of $CLK_{ADC}$ 210. As shown in FIG. 3, the frequency of $CLK_{ADC}$ 210 decreases as $F_{OSC}$ is divided by each subsequent divide value. In the example shown, for a divide address of '0', provided to frequency divider 204 by division factor generator 206, $F_{OSC}$, which is 20 MHz in this example, is divided by 168, resulting in $CLK_{ADC}$ 210 having a frequency of 119 KHz. $CLK_{ADC}$ 210 may remain at 119 KHz for 32 cycles, following which the increment signal may be asserted, resulting in a divide address of '1' being provided to frequency divider 204, leading to $F_{OSC}$ being divided by 170, which in turn results in a frequency of 117.6 KHz for $CLK_{ADC}$ 210. $CLK_{ADC}$ 210 may again be held at this frequency for 32 cycles. Subsequent versions of $CLK_{ADC}$ 210, each with a different frequency from within the determined range, may similarly be generated, ending with address '31', after which the process may begin again, starting with address '0'. In each case, $CLK_{ADC}$ 210 may be held at a given frequency for 32 cycles. It should again be noted that clock edge counter 208 may be configured to count any number of edges of $CLK_{ADC}$ 210 at a given frequency of $CLK_{ADC}$ 210, from as low as a single edge to any specified number of edges as required or as is optimal.

While the embodiments presented herein have been described using numeric examples for the nominal sampling frequency (of an ADC), the frequency operating range, the frequency step size, and the resolution of the ADC, those skilled in the art will appreciate that various other embodiments may similarly be realized with numbers different from those presented. For example, the resolution, or frequency step-size for stepping the frequency of the sampling clock of the ADC may be increased or decreased as permitted or required within a given system. Similarly, ADCs may be set up to operate within a broader range of sampling clock frequencies, potentially leading to an increased number different frequencies within a particular desired frequency range.

Therefore, though the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A system comprising:
   a clock generating circuit configured to provide a sampling clock; and
   a converter circuit having a clock input for receiving the sampling clock, wherein in each one of one or more conversion cycles, the converter circuit is operable to sample a first signal according to the sampling clock and to generate a numeric value of the first signal;
   wherein the clock generating circuit is operable to change a frequency of the sampling clock a specified number of times within each one of the one or more conversion cycles to reduce an error component of the numeric value, wherein the error component is produced by an interfering signal.

2. The system of claim 1, wherein the interfering signal is one of:
   an electromagnetic interference (EMI) signal coherent with the sampling clock; and
   a noise residing on the voltage supply and coherent with the sampling clock.

3. The system of claim 1, wherein each time the clock generating circuit is changing the frequency of the sampling clock within a given one of the one or more conversion cycles, the clock generating circuit is operable to change the frequency of the sampling clock to a frequency different from all preceding frequencies of the sampling clock within the given one of the one or more conversion cycles.

4. The system of claim 3, wherein the clock generating circuit is operable to select the frequency from a plurality of previously specified frequencies.

5. The system of claim 1, wherein, within any given one of the one or more conversion cycles, the clock generating circuit is operable to maintain the frequency of the sampling clock for a specified number of cycles of the sampling clock.

6. The system of claim 1, further comprising a semiconductor device coupled to the converter circuit, wherein the semiconductor device has a non-linear input-output characteristic that varies with temperature, and wherein the semiconductor device is configured to produce the first signal.

7. The system of claim 6, wherein the semiconductor device comprises a PN-junction.

8. The system of claim 7, wherein the semiconductor device comprises one of:
   a diode; and
   a bipolar junction transistor (BJT).

9. The system of claim 7, wherein the first signal comprises a $\Delta V_{BE}$ voltage according to at least two different $V_{BE}$ voltages developed across the PN-junction;
   wherein the numeric value corresponds to a temperature of the semiconductor device.

10. The system of claim 6, further comprising a capacitance coupled across end terminals of the semiconductor device to reduce additional effects of the interfering signal on the first signal.

11. The system of claim 1, wherein the clock generating circuit comprises:
    a first component configured to generate a reference clock having a specified frequency; and
    a second component configured to receive the reference clock and to generate the sampling clock based on the reference clock, wherein the frequency of the sampling clock is a fraction of the specified frequency.

12. The system of claim 11, wherein the clock generating circuit further comprises a third component configured to provide a division factor to the second component, wherein the division factor determines the fraction.

13. The system of claim 12, wherein the clock generating circuit further comprises a fourth component configured to receive the sampling clock;
    wherein the fourth component is operable to count edges of the sampling clock;
    wherein, after having counted a specified number of edges of the sampling clock, the fourth component is operable to provide a control signal to the third component; and
    wherein the third component is operable to provide the division factor in response to the control signal.

14. The system of claim 13, wherein the division factor has a different value each time the third component provides the division factor to the second component within any given one of the one or more conversion cycles.

15. A method comprising:
    generating a sampling clock having a frequency;
    generating a respective plurality of samples by sampling a first signal according to the sampling clock;
    generating a numeric value of the first signal according to the respective plurality of samples; and
    changing the frequency of the sampling clock a specified number of times during said sampling the first signal and said generating the respective plurality of samples to reduce an error component of the numeric value, wherein the error component is produced by an interfering signal.

16. The method of claim 15, wherein said sampling the first signal and said generating the respective plurality of samples, said generating the numeric value, and said changing the frequency of the sampling clock the specified number of times are performed for each one of one or more conversion cycles.

17. The method of claim 15, wherein the interfering signal is one of:
   an electromagnetic interference (EMI) signal coherent with the sampling clock; and
   a noise residing on the voltage supply and coherent with the sampling clock.

18. The method of claim 17, wherein said changing the frequency of the sampling clock the specified number of times comprises changing the frequency of the sampling clock to a frequency different from any frequency to which the sampling clock has been previously changed within the specified number of times.

19. The method of claim 18, wherein said changing the frequency of the sampling clock comprises changing the frequency of the sampling clock to one of a plurality of previously specified frequencies.

20. The method of claim 15, further comprising maintaining the frequency of the sampling clock for a specified number of cycles of the sampling clock.

21. The method of claim 15, wherein the first signal is produced by a semiconductor device having a non-linear input-output characteristic that varies with temperature.

22. The method of claim 21, wherein the first signal comprises a $\Delta V_{BE}$ voltage according to at least two different $V_{BE}$ voltages developed across the PN-junction;
   wherein the numeric value corresponds to a temperature of the semiconductor device.

23. The method of claim 15, further comprising generating a reference clock having a specified frequency;
   wherein said generating the sampling clock comprises generating the sampling clock according to the reference clock, wherein the frequency of the sampling clock is a fraction of the specified frequency.

24. The method of claim 23, wherein said generating the sampling clock according to the reference clock comprises determining the fraction by dividing the specified frequency by a division factor.

25. The method of claim 24, wherein said changing the frequency of the sampling clock the specified number of times comprises:
   for each one of the specified number of times:
      counting a specified number of edges of the sampling clock;
      asserting a control signal after having performed said counting; and
      changing the division factor in response to said asserting the control signal.

26. The method of claim 25, wherein said changing the division factor comprises changing the division factor to a division factor different from any previous division factor within the specified number of times.

* * * * *